United States Patent
Suh et al.

(10) Patent No.: US 7,449,360 B2
(45) Date of Patent: Nov. 11, 2008

(54) PHASE CHANGE MEMORY DEVICES AND FABRICATION METHODS THEREOF

(75) Inventors: Dong-Seok Suh, Seoul (KR); Yeon-Ho Khang, Yongin-si (KR); Vassill Leniachine, Suwon-si (KR); Mi-Jeong Song, Suwon-si (KR); Sergey Antonov, Petersburg (RU)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 188 days.

(21) Appl. No.: 11/336,791

(22) Filed: Jan. 23, 2006

(65) Prior Publication Data

US 2006/0180803 A1    Aug. 17, 2006

(30) Foreign Application Priority Data

Feb. 17, 2005    (KR) ............... 10-2005-0013143

(51) Int. Cl.
*H01L 21/06*    (2006.01)

(52) U.S. Cl. ............... 438/102; 438/597; 257/E21.068

(58) Field of Classification Search ............... 438/102, 438/103; 257/E21.068
See application file for complete search history.

(56) References Cited

U.S. PATENT DOCUMENTS

| | | | | |
|---|---|---|---|---|
| 5,444,005 A * | 8/1995 | Kim et al. | ... | 438/396 |
| 6,413,812 B1 * | 7/2002 | Harshfield | ... | 438/237 |
| 6,545,903 B1 * | 4/2003 | Wu | ... | 365/148 |
| 7,259,023 B2 * | 8/2007 | Kuo et al. | ... | 438/3 |
| 2005/0112896 A1 * | 5/2005 | Hamann et al. | ... | 438/694 |
| 2006/0281216 A1 * | 12/2006 | Chang et al. | ... | 438/102 |

* cited by examiner

*Primary Examiner*—Scott B. Geyer
*Assistant Examiner*—Angel Roman
(74) *Attorney, Agent, or Firm*—Harness, Dickey & Pierce P.L.C.

(57) ABSTRACT

In a memory device, at least one conductive contact having a width of less than, or equal to, about 30 nm may be formed on a first electrode. A dielectric layer may be formed on the sides of the at least one conductive contact, and a phase change material film may be formed on the conductive contact. A second electrode may be formed on the phase change material.

12 Claims, 5 Drawing Sheets

PHASE CHANGE MEMORY DEVICES AND FABRICATION METHODS THEREOF

PRIORITY STATEMENT

This application claims priority under 35 U.S.C. § 119 to Korean Patent Application No. 10-2005-0013143, filed on Feb. 17, 2005, in the Korean Intellectual Property Office (KIPO), the entire contents of which are incorporated herein by reference.

BACKGROUND

1. Field of the Invention

Example embodiments of the present invention relate to phase change memory devices and fabrication methods thereof.

2. Description of the Related Art

Semiconductor memory devices may be volatile or non-volatile memory devices according to whether data is retained when powered off. Volatile memory devices include, for example, dynamic random access memories (DRAM), static random access memories (SDRAM), etc. Nonvolatile memory devices include, for example, flash memory devices. Related art memory devices represent logic or binary values "0" or "1" according to whether or not an electric charge is stored therein. In one example, a DRAM may require a higher charge storage capacity because it may need to be refreshed periodically. However, as charge storage capacity increases, so does surface area of a capacitor electrode of the DRAM. This may suppress integration of the DRAM.

In another example, a flash memory cell has a gate pattern including a gate insulating film, a floating gate, a dielectric film and a control gate, which may be sequentially deposited on a semiconductor substrate. Data may be written in or erased from the flash memory cell by tunneling of electric charges through the gate insulating film. To do so, an operating voltage higher than a source voltage may be required, and the flash memory device may need to have an amplifier circuit for generating voltages necessary for the data writing/erasing operations.

An example memory, which may have nonvolatile/random access characteristics, an increased integration degree and/or a simple structure is a phase change memory device using phase change material. The phase change material may become an amorphous state or a crystalline state according to strength of a current (e.g., joule's heat) provided thereto, and the amorphous phase change material may have an electrical conductivity different from that of the crystalline phase change material.

FIG. 1 is an example graph illustrating an operating method of a phase change memory device. The graph of FIG. 1 may describe a method for writing/erasing data to/from a phase change memory cell. In the graph, a horizontal axis represents time and a vertical axis represents a temperature applied to a phase change material film.

Referring to FIG. 1, the phase change material film is phase-changed into an amorphous state when heated during a time period $T_1$ at temperatures higher than its melting temperature $T_m$ and cooled rapidly (curve I). The phase change material film is phase-changed into a crystalline state when heated during a time period $T_2$ at temperatures between a crystallizaton temperature $T_c$ and the melting temperature $T_m$, and cooled slowly (curve II). The time period $T_2$ may be longer than the time period $T_1$.

The amorphous phase change material film may have a higher resistance than the crystalline phase change material film. Accordingly, whether data stored in the phase change memory cell is logic "1" or logic "0" may be determined by detecting a current flowing through the phase change material film. The phase change material film may be comprised of a chalcogenide or any other suitable substance having similar or substantially similar properties. For example, the phase change material film may be comprised of a compound containing germanium (Ge), antimony (Sb), tellurium (Te) or any other suitable element, substance or compound having similar, or substantially similar, properties.

FIG. 2 is a schematic sectional view illustrating a structure of a related art phase change memory device.

Referring to FIG. 2, the related art phase change memory device may include a lower electrode 10, an upper electrode 18, a thin phase change material film 16 interposed between the electrodes 10 and 18, and a conductive contact 14 electrically connecting the lower electrode 18 with the phase change material film 16. Sides of the lower electrode 10 and the conductive contact 14 may be formed within (e.g., buried) in an insulation layer 12 and the lower electrode 10 may be electrically connected to a drain (D) region of a transistor 5. The upper electrode 18 may be electrically connected to a bit line (BL). A gate electrode (G) of the transistor 5 may be electrically connected to a word line (WL).

In the example related art phase change memory device of FIG. 2, when a current flows between the lower electrode 10 and the upper electrode 18, a current having flowed through the conductive contact 14 may flow through a contact surface 20 into the phase change material film 16. As a result, a crystalline state of phase change material around the contact surface 20 may change. The strength of the current necessary for changing the state of the phase change material may be proportional to the area of the contact surface 20. For example, the necessary current strength may be decreased as the contact surface area is reduced. However, reduction of the widths and/or areas of contact surfaces of conductive contacts may be limited due to the photolithographic process used to form the conductive contacts. This may result in lesser integration of semiconductor devices.

SUMMARY OF THE INVENTION

Example embodiments of the present invention provide phase change memory devices, and methods of fabricating the same, which may require a lower driving current pulse and/or consume less power.

A memory device according to an example embodiment of the present invention may include at least one conductive contact formed on a first electrode. The conductive contact may have a width of less than, or equal to, about 30 nm. A dielectric layer may be formed on the sides of the at least one conductive contact, and a phase change material film may be formed on the conductive contact. A second electrode may be formed on the phase change material film. A transistor may be electrically connected to the first electrode. A phase change catalyst may be formed between the sides of the conductive contact and the dielectric layer, such that the phase change catalyst contacts the phase change material film.

In a method for fabricating a phase change memory device according to an example embodiment of the present invention, a first electrode may be formed on a semiconductor substrate, which may include a transistor. At least one conductive contact may be formed on the first electrode, and the dielectric layer may be formed on first electrode such that the dielectric layer contacts the sides of the conductive contact. A phase change material film and a second electrode may be formed on the conductive contact and the dielectric layer. The phase change material film and the second electrode may be patterned.

In example embodiments of the present invention, a conductive contact layer, a first mask layer and a second mask layer may be sequentially formed on the first electrode. The second mask layer may have a width less than the first mask layer. An oxide layer may be formed on at least one side of the second mask layer and may have a width less than, or equal to, about 30 nm. The second mask layer may be removed, and the first mask layer and the conductive contact layer may be etched to form at least one stack. A dielectric layer may be formed on the at least one stack and the first electrode, and the dielectric layer and the at least one stack may be planarized.

In a method of forming a memory device, according to another example embodiment of the present invention, a first electrode may be formed on a semiconductor substrate including a transistor. A conductive contact may be formed on the first electrode, and a phase change catalyst may be formed on each side of the conductive contact. A dielectric layer may be formed on each side of the phase change catalyst, and a phase change material film and a second electrode may be formed on the conductive contact and the first electrode. The phase change material film and the second electrode may be patterned.

In example embodiments of the present invention, the phase change catalyst may include one of ZnS, ZnS+SiO$_2$, and Al$_2$O$_3$, the first electrode, the second electrode and/or the conductive contact may be comprised of materials including at least Ti. The dielectric layer may include one of Si$_3$N$_4$ and TEOS oxide and/or the phase change material film is formed to have a thickness of about 1000 Å.

In example embodiments of the present invention, the conductive contact layer, a first mask layer and a second mask layer may be sequentially formed on the first electrode. The second mask layer may have a width less than the first mask layer. An oxide layer may be formed on at least one side of the second mask layer, the oxide layer having a width less than, or equal to, about 30 nm. The second mask layer may be removed and the first mask layer and the conductive contact layer may be etched to form at least one stack. A phase change catalyst layer may be formed on the first electrode and may cover the at least one stack. A portion of the phase change catalyst layer may be removed to form the phase change catalyst on each side of the conductive contact, and a dielectric layer covering the at least one stack and remaining portion of the phase change catalyst layer may be formed. The dielectric layer, the at least one stack, and the phase change catalyst layer may be planarized.

In example embodiments of the present invention, the oxide layer may be formed by depositing an oxide layer on the first and second mask layers, and etching the oxide layer to form an oxide layer on at least one side of the second mask layer. The oxide layer may be deposited to have a thickness of about 20 nm to about 50 nm, inclusive, or to have a thickness of less than, or equal to, about 30 nm. The oxide layer may be deposited using chemical vapor deposition or atomic layer deposition.

BRIEF DESCRIPTION OF THE DRAWINGS

The present invention will become more apparent by describing in detail the example embodiments shown in the attached drawings in which.

DETAILED DESCRIPTION OF EXAMPLE EMBODIMENTS OF THE PRESENT INVENTION

Figure 1:
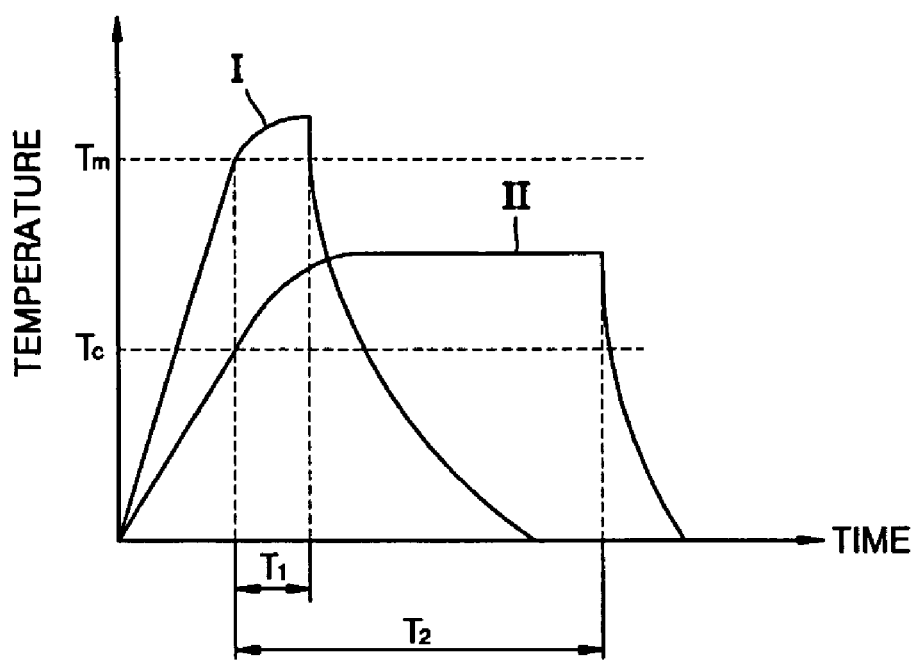
FIG. 1 is an example graph illustrating an operating method of a related art phase change memory device.
Figure 2:
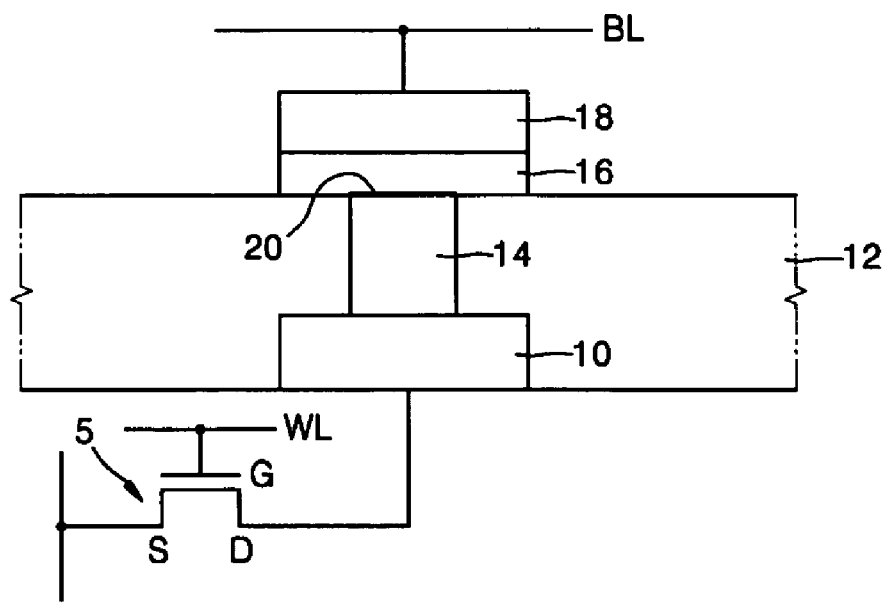
FIG. 2 is a schematic sectional view illustrating a structure of a related art phase change memory device.

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element or layer is referred to as being "formed on" another element or layer, it can be directly or indirectly formed on the other element or layer. That is, for example, intervening elements or layers may be present. In contrast, when an element or layer is referred to as being "directly formed on" to another element, there are no intervening elements or layers present. Other words used to describe the relationship between elements or layers should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Figure 3:
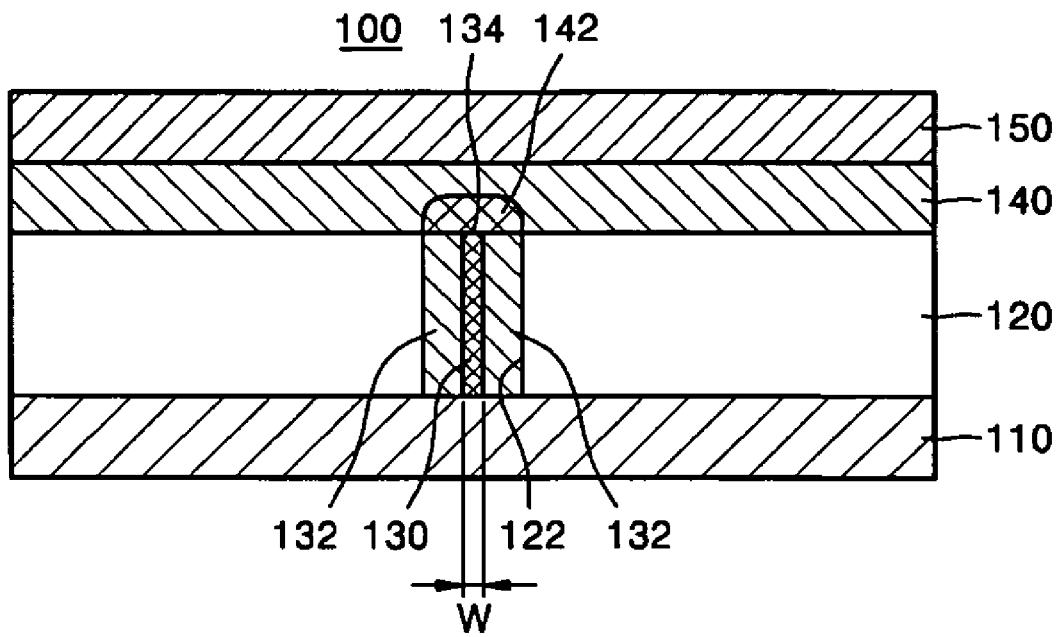
FIG. 3 is a sectional view of a phase change memory device according to an example embodiment of the present invention.

FIG. 3 is a sectional view of a memory device according to an example embodiment of the present invention.

Referring to FIG. 3 a phase change memory device 100 may include a lower electrode 110 electrically connected to a transistor (not shown). The transistor may be integrated into or on a semiconductor substrate. An insulation layer 120 may be formed on the lower electrode 110, and a contact hole 122 may be formed in the insulation layer 120. A conductive contact 130 may be formed (e.g., vertically formed) in the contact hole 122.

A phase change catalyst 132 may be formed on each side of, or around, the conductive contact 130. A phase change material film 140 contacting the conductive contact 130 may be formed on the insulation layer 120. An upper electrode 150 may be formed on the phase change material film 140.

The conductive contact 130 may be comprised of TiN, TiAlN or any other suitable material with similar, or substantially similar, conductive properties, and may have a width of about 30 nm or less. In an example embodiment of the present invention, the upper electrode 150 and/or the conductive contact 130 may be formed to have a contact surface 134 of about 200 nm×20 nm there between. The contact surface 134 may have a width of less than, or equal to, about 30 nm.

The phase change material film 140 may be comprised of a chalcogenide, or any other material with similar or substantially similar properties. Chalcogenide and similar substances are well known to those skilled in the art. The phase change catalyst 132 may be comprised of, for example, ZnS, ZnS+SiO$_2$, or Al$_2$O$_3$, and may accelerate and/or improve a phase change of the phase change material film 140. Reference numeral 142 denotes an area in which the phase change material film 140 may be phase-changed in response to a current flow from, for example, the outside.

FIGS. 4A through 4I are sectional views illustrating a method for fabricating a phase change memory device according to an example embodiment of the present invention. For the sake of brevity, a method for fabricating two memory cells, according to an example embodiment of the present invention, is illustrated in the drawings. However, it will be understood that any number of memory cells may be fabricated using example embodiments of the present invention.

Figure 4A:
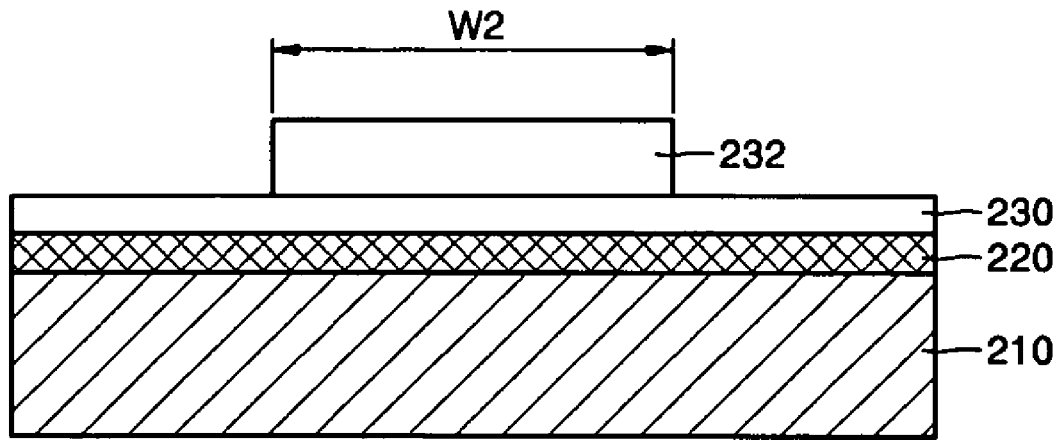
FIGS. 4A through 4I are sectional views illustrating a method for fabricating a phase change memory device according to an example embodiment of the present invention.

Referring first to FIG. 4A, a transistor (not shown) may be formed on a semiconductor substrate (not shown) using any conventional method. A lower electrode 210 may be formed and electrically connected to a drain region of the transistor. A heat dissipation layer 220 may be formed on the lower electrode 210. The lower electrode 210 may be comprised of TiN, TiAlN or any other material or substance having similar or substantially similar properties. A first mask layer 230 may be formed on the heat dissipation layer 220. The first mask layer 230 may be comprised of Si$_3$N$_4$ or any other substance or material having similar or substantially similar properties. A second mask layer 232 having an etching speed different from that of the first mask layer 230 may be formed on the first mask layer 230. The second mask layer 232 may be comprised of SiGe or any other substance or material having similar or substantially similar properties. The second mask layer 232 may be patterned to have a second width W2. The second width W2 may be set to correspond to a desired distance between two memory cells, and/or may be less than the width of the first mask layer 230.

Figure 4B:
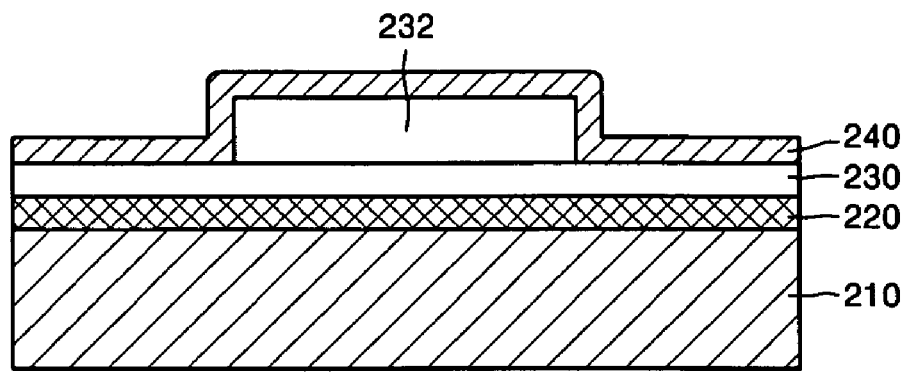

Referring to FIG. 4B, an oxide layer 240 may be deposited on the first mask layer 230 so as to cover the first and second mask layers 230 and 232. The oxide layer 240 may be formed of SiO$_2$ or any other substance or material having similar or substantially similar properties, and/or may have a thickness of about 20 nm.

Figure 4C:
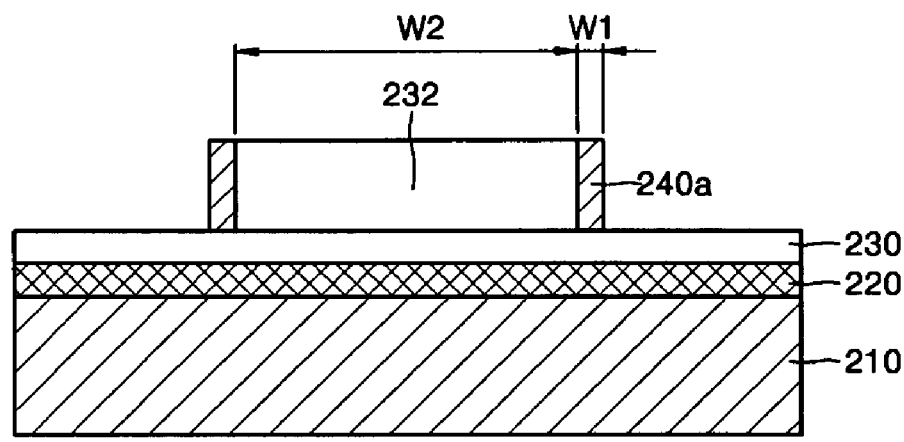

Referring to FIG. 4C, an oxide layer 240A with a second width W2 may be formed on the both sides of the second mask layer 232 by patterning the oxide layer 240. The second width W2 may be determined using the above deposition process.

Figure 4D:
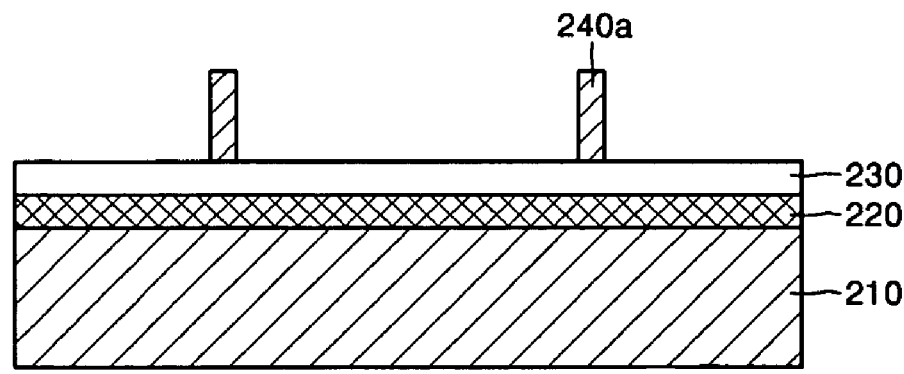

Referring to FIG. 4D, the second mask layer 232 between the two oxide layers 240A may be removed using an etching agent that may etch the first mask layer 230 and the second mask layer 232 in different ratios.

Figure 4E:
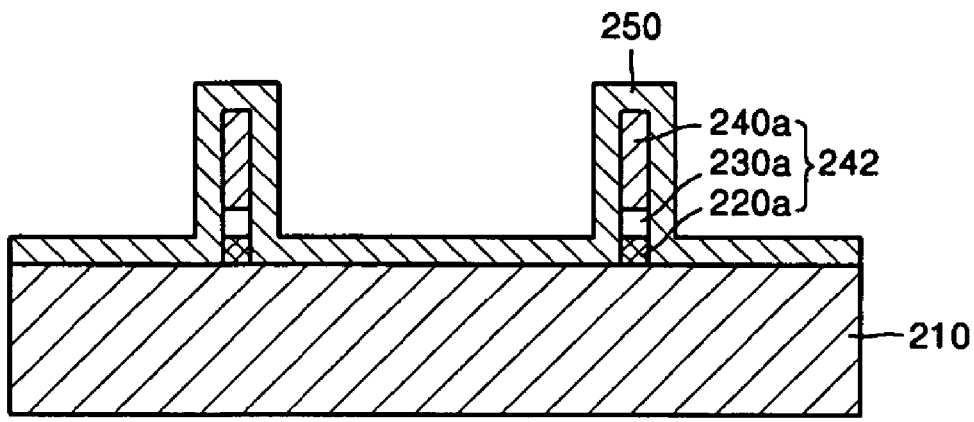

Referring to FIG. 4E, the first mask layer 230 and/or the heat dissipation layer 220 may be etched (e.g., anisotropically etched) in sequence with a mask of the oxide layer 240A. A resulting heat dissipation layer 220A may correspond to the conductive contact 130 shown in FIG. 3. A phase change catalyst 250 may be deposited on the lower electrode 210 so as to cover a stack 242, which may include a conductive contact 220A, a first mask layer 230A and/or the oxide layer 240A. The phase change catalyst 250 may be comprised of ZnS, ZnS+SiO$_2$, or Al$_2$O$_3$ or any other substance or material having similar, or substantially similar, properties. The phase change catalyst 250 may be deposited using chemical vapor deposition (CVD), atomic layer deposition (ALD) or any other suitable deposition process.

Figure 4F:
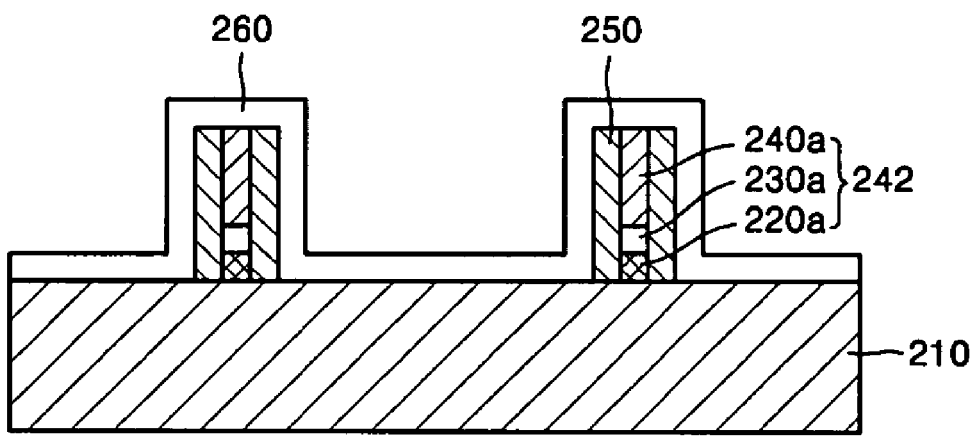

Referring to FIG. 4F, the portion of the phase change catalyst 250 not covering sides of the stack 242 may be etched (e.g., anisotropically etched) and removed. A dielectric layer 260 may be formed on the lower electrode 210 using CVD, ALD or any other suitable deposition process such that the dielectric layer 260 may cover the stack 242 and/or the phase change catalyst 250. The dielectric layer 260 may be formed of Si$_3$N$_4$, TEOS oxide or any other substance or material having similar or substantially similar properties and/or may have a thickness of about 20 to 50 nm, inclusive. The dielectric layer 260 may be formed to have a thickness larger than at least a height of the conductive contact 220A.

Figure 4G:
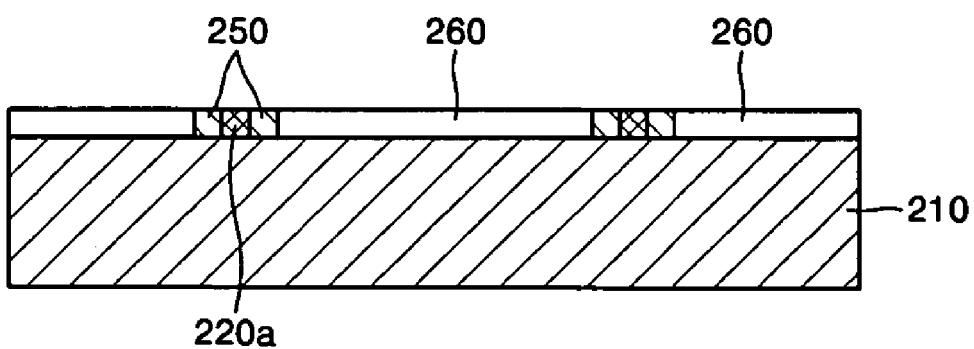

Referring to FIG. 4G, the stack 242, the phase change catalyst 250 and/or the dielectric suitable layer 260 may be planarized using chemical mechanical polishing (CMP) or any other suitable polishing process so that the conductive contact 220A may be exposed.

Figure 4H:
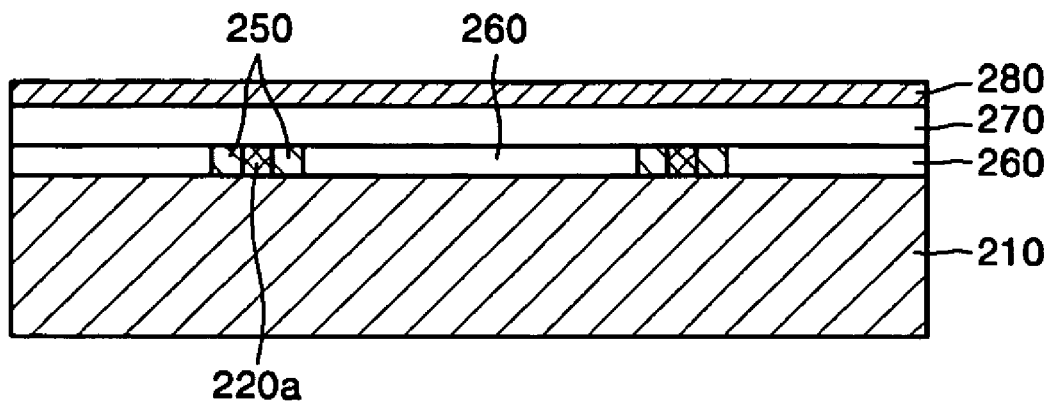

Referring to FIG. 4H, a phase change material film 270 having a thickness of about 1000 Å may be deposited on the lower electrode 210 so as to cover the conductive contact 220A, the phase change catalyst 250 and/or the dielectric layer 260. An upper electrode 280 may be deposited on the phase change material film 270.

Figure 4I:
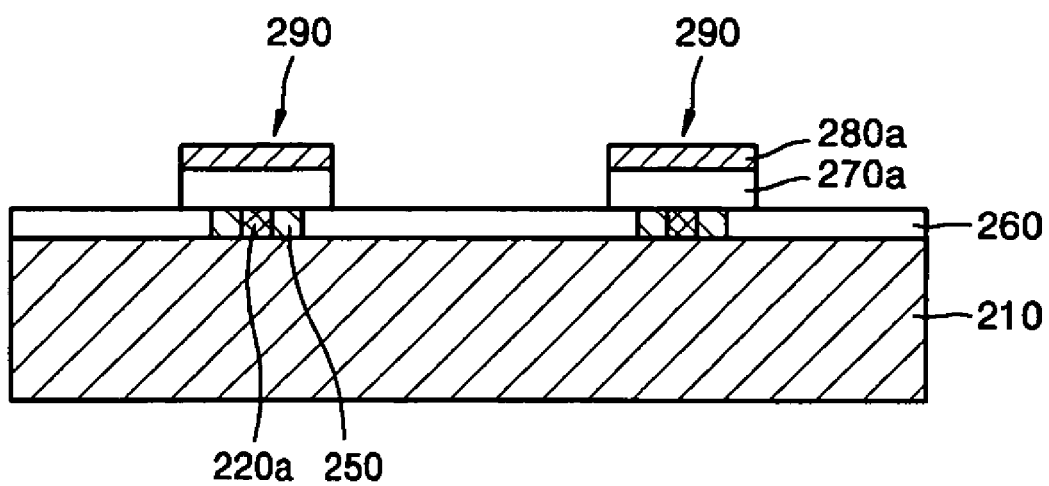

Referring to FIG. 4I, a phase change material film 270A and/or an upper electrode 280A may be formed on the conductive contact 220A, and two memory cells 290 may be formed by patterning (e.g., sequentially patterning) the upper electrode 280 and/or the phase change material film 270. A discrete memory device may be produced through a singulation or any other suitable process.

Example embodiments of the present invention may provide a conductive contact having a width of less than, or equal to, 30 nm, reduce a contact area between the conductive contact and the phase change material film, increase a current density at the contact area, and/or reduce the strength of a current applied to the memory device.

In example embodiments, the phase change material film may include chalcogenide alloys such as germanium-antimony-tellurium (Ge—Sb—Te), arsenic-antimony-tellurium (As—Sb—Te), tin-antimony-tellurium (Sn—Sb—Te), or tin-indium-antimony-tellurium (Sn—In—Sb—Te), arsenic-germanium-antimony-tellurium (As—Ge—Sb—Te). Alternatively, the phase change material film may include an element in Group VA-antimony-tellurium such as tantalum-antimony-tellurium (Ta—Sb—Te), niobium-antimony-tellurium (Nb—Sb—Te) or vanadium-antimony-tellurium (V—Sb—Te) or an element in Group VA-antimony-selenium such as tantalum-antimony-selenium (Ta—Sb—Se), niobium-antimony-selenium (Nb—Sb—Se) or vanadium-antimony-selenium (V—Sb—Se). Further, the phase change material film may include an element in Group VIA-antimony-tellurium such as tungsten-antimony-tellurium (W—Sb—Te), molybdenum-antimony-tellurium (Mo—Sb—Te), or chrome-antimony-tellurium (Cr—Sb—Te) or an element in Group VIA-antimony-selenium such as tungsten-antimony-selenium (W—Sb—Se), molybdenum-antimony-selenium (Mo—Sb—Se) or chrome-antimony-selenium (Cr—Sb—Se).

Although the phase change material film is described above as being formed primarily of ternary phase-change chalcogenide alloys, the chalcogenide alloy of the phase change material could be selected from a binary phase-change chalcogenide alloy or a quaternary phase-change chalcogenide alloy. Example binary phase-change chalcogenide alloys may include one or more of Ga—Sb, In—Sb, In—Se, $Sb_2$—$Te_3$ or Ge—Te alloys; example quaternary phase-change chalcogenide alloys may include one or more of an Ag—In—Sb—Te, (Ge—Sn)—Sb—Te, Ge—Sb—(Se—Te) or $Te_{81}$—$Ge_{15}$—$Sb_2$—$S_2$ alloy, for example.

In an example embodiment, the phase change material film may be made of a transition metal oxide having multiple resistance states, as described above. For example, the phase change material may be made of at least one material selected from the group consisting of NiO, $TiO_2$, HfO, $Nb_2O_5$, ZnO, $WO_3$, and CoO or GST ($Ge_2Sb_2Te_5$) or PCMO($Pr_xCa_{1-x}MnO_3$). The phase change material film may be a chemical compound including one or more elements selected from the group consisting of S, Se, Te, As, Sb, Ge, Sn, In and Ag.

While example embodiments of the present invention have been particularly shown and described with reference to the drawings, it will be understood by those of ordinary skill in the art that various changes in form and details may be made therein without departing from the spirit and scope of the present invention as defined by the following claims.

What is claimed is:

1. A method for fabricating a memory device, the method comprising:
   forming a first electrode on a semiconductor substrate including a transistor;
   forming at least one conductive contact on the first electrode;
   forming a dielectric layer on the first electrode such that the dielectric layer contacts sides of the conductive contact,
   wherein forming the conductive contact and the dielectric layer includes
      sequentially forming a conductive contact layer, a first mask layer and a second mask layer on the first electrode, the second mask layer having a width less than the first mask layer,
      forming an oxide layer on at least one side of the second mask layer, the oxide layer having a width less than, or equal to, about 30 nm,
      removing the second mask layer;
      etching the first mask layer and the conductive contact layer to form at least one stack,
      forming a dielectric layer on the at least one stack and the first electrode, and
      planarizing the dielectric layer and the at least one stack;
   forming a phase change material film and a second electrode on the conductive contact and the dielectric layer; and
   patterning the phase change material film and the second electrode.

2. The method of claim 1, wherein the forming of the oxide layer further includes,
   depositing an oxide layer on the first and second mask layers, and
   etching the oxide layer to form an oxide layer on at least one side of the second mask layer.

3. The method of claim 2, wherein the oxide layer is deposited to have a thickness of less than the width of the conductive contact.

4. The method of claim 2, wherein the oxide is deposited to have a thickness of about 20 nm.

5. The method of claim 2, wherein the oxide layer is deposited using chemical vapor deposition or atomic layer deposition.

6. A method of forming a memory device, the method comprising:
   forming a first electrode on a semiconductor substrate including a transistor;
   forming a conductive contact on the first electrode;
   forming a phase change catalyst on each side of the conductive contact;
   forming a dielectric layer on each side of the phase change catalyst,
   wherein the forming of the conductive contact, the phase change catalyst and the dielectric layer further includes,
      sequentially forming a conductive contact layer, a first mask layer and a second mask layer on the first electrode, the second mask layer having a width less than the first mask layer,
      forming an oxide layer on at least one side of the second mask layer, the oxide layer having a width less than, or equal to, about 30 nm,
      removing the second mask layer;
      etching the first mask layer and the conductive contact layer to form at least one stack,
      forming a phase change catalyst layer on the first electrode and covering the at least one stack,
      removing a portion of the phase change catalyst layer to form the phase change catalyst on each side of the conductive contact,
      forming a dielectric layer covering the at least one stack and remaining portion of the phase change catalyst layer, and
      planarizing the dielectric layer, the at least one stack, and the phase change catalyst layer;
   sequentially forming a phase change material film and a second electrode on the conductive contact and the first electrode; and
   patterning the phase change material film and the second electrode.

7. The method of claim 6, wherein the forming of the oxide layer further includes, depositing an oxide layer on the first and second mask layers, and etching the oxide layer to form an oxide layer on at least one side of the second mask layer.

8. The method of claim 6, wherein the oxide layer is deposited to have a thickness of less than the width of the conductive contact.

9. The method of claim 6, wherein the oxide is deposited to have a thickness of about 20 nm.

10. The method of claim 6, wherein the oxide layer is deposited using chemical vapor deposition or atomic layer deposition.

11. The method of claim 6, wherein the phase change catalyst layer includes one of ZnS, $ZnS+SiO_2$, and $Al_2O_3$.

12. The method of claim 6, wherein the phase change catalyst layer is formed using chemical vapor deposition or atomic layer deposition.

* * * * *

UNITED STATES PATENT AND TRADEMARK OFFICE
CERTIFICATE OF CORRECTION

PATENT NO.        : 7,449,360 B2                                            Page 1 of 1
APPLICATION NO.   : 11/336791
DATED             : November 11, 2008
INVENTOR(S)       : Dong-Seok Suh et al.

It is certified that error appears in the above-identified patent and that said Letters Patent is hereby corrected as shown below:

On the Title page item (75) should read Inventors: Dong-Seok Suh, Seoul (KR);

Yoon-Ho Khang, Yongin-si (KR);

Vassill Leniachine, Suwon-si (KR);

Mi-Jeong Song, Suwon-si (KR);

Sergey Antonov, Petersburg (RU)

Signed and Sealed this

Twenty-sixth Day of May, 2009

JOHN DOLL
*Acting Director of the United States Patent and Trademark Office*